United States Patent
Derderian et al.

(10) Patent No.: US 7,253,104 B2
(45) Date of Patent: Aug. 7, 2007

(54) METHODS OF FORMING PARTICLE-CONTAINING MATERIALS

(75) Inventors: Garo J. Derderian, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 412 days.

(21) Appl. No.: 10/726,328

(22) Filed: Dec. 1, 2003

(65) Prior Publication Data

US 2005/0118449 A1    Jun. 2, 2005

(51) Int. Cl.
H01L 21/44 (2006.01)

(52) U.S. Cl. .............. 438/665; 438/685; 438/962; 438/964; 257/E21.158; 427/217

(58) Field of Classification Search ........... 438/665, 438/962, 964; 427/185, 191, 192, 201, 205, 427/241, 215–217
See application file for complete search history.

(56) References Cited

U.S. PATENT DOCUMENTS

| | | | |
|---|---|---|---|
| 5,998,824 A * | 12/1999 | Lee ........................ 257/309 |
| 6,207,487 B1 * | 3/2001 | Kim et al. ................ 438/238 |
| 6,303,516 B1 * | 10/2001 | Morita et al. ............. 438/758 |
| 6,304,024 B1 * | 10/2001 | Uda et al. ................ 313/310 |
| 6,444,495 B1 | 9/2002 | Leung et al. |
| 6,730,596 B1 * | 5/2004 | Fukunaga et al. ......... 438/660 |
| 6,737,364 B2 * | 5/2004 | Black et al. .............. 438/778 |
| 6,924,523 B2 * | 8/2005 | Aochi et al. .............. 257/296 |
| 6,951,816 B2 * | 10/2005 | Nopper et al. ............ 438/678 |
| 2001/0024387 A1 * | 9/2001 | Raaijmakers et al. ..... 365/200 |
| 2002/0137260 A1 | 9/2002 | Leung et al. |
| 2002/0150687 A1 * | 10/2002 | Matsuba ................. 427/385.5 |
| 2003/0026989 A1 | 2/2003 | George et al. |
| 2003/0224104 A1 * | 12/2003 | Fukunaga et al. ........ 427/146 |
| 2004/0043577 A1 * | 3/2004 | Hill ....................... 438/396 |
| 2004/0077183 A1 * | 4/2004 | Chung ..................... 438/785 |
| 2004/0191698 A1 * | 9/2004 | Yagi et al. ............... 430/320 |

OTHER PUBLICATIONS

Klaus, J.W. et al., "Atomic Layer Deposition of $SiO_2$ Using Catalyzed and Uncatalyzed Self-Limiting Surface Reactions", Surface Review and Letters, vol. 6, No. 3 & 4 (1999), © World Scientific Pub. Co., pp. 435-448.

Frank, M. et al., "Enhanced Initial Growth of Atomic-Layer-Deposited Metal Oxides on Hydrogen-Terminated Silicon", App. Phys. Let., vol. 83, No. 4, Jul. 28, 2003, pp. 740-742.

(Continued)

*Primary Examiner*—B. William Baumeister
*Assistant Examiner*—Matthew W. Such
(74) *Attorney, Agent, or Firm*—Wells St. John P.S.

(57) ABSTRACT

The invention includes methods of forming particle-containing materials, and also includes semiconductor constructions comprising particle-containing materials. One aspect of the invention includes a method in which a first monolayer is formed across at least a portion of a semiconductor substrate, particles are adhered to the first monolayer, and a second monolayer is formed over the particles. Another aspect of the invention includes a construction containing a semiconductor substrate and a particle-impregnated conductive material over at least a portion of the semiconductor substrate. The particle-impregnated conductive material can include tungsten-containing particles within a layer which includes tantalum or tungsten.

16 Claims, 5 Drawing Sheets

OTHER PUBLICATIONS

Rosidian, A.. et al., "Formation of Ultrahard Metal Oxide Nanocluster Coatings at Room Temperature by Electrostatic Self-Assembly", SPIE vol. 3675 (1999), pp. 113-119.

Sakaue, H. et al., "Conformable CVD of $SiO_2$ into Deep Trench Using the Digital Method", Extended Abstracts of the 22nd (1990 International) Conf. on Solid State Devices and Materials, Sendai (1990), pp. 921-924.

Mountziaris, T. et al., "Gas-Phase and Surface Chemistry in Electronic Materials Processing", Materials Research Society Symposium Proceedings, vol. 334, held Nov. 29, 1993-Dec. 2, 1993, Boston, MA, pp. 1-36.

Perez, I. et al., "Fabrication and Characterization of 4H-SiC MOS Capacitors with Atomic Layer Deposited (ALD) $SiO_2$", IEEE Jul. 2000, pp. 144-147.

Sakaue, H. et al., "Digital Chemical Vapor Deposition of $SiO_2$ Using a Repetitive Reaction of Triethylsilane/Hydrogen and Oxidation", JP Journal of App. Phys., vol. 70, No. 1B, Jan. 1991, pp. L 124-L 127.

Klaus, J. et al., "Atomic Layer Deposition of $SiO_2$ at Room Temperature Using $NH_3$-Catalyzed Sequential Surface Reactions", Surface Science 447 (2000), pp. 81-90.

Cameron, M. et al., "Atomic Layer Deposition of $SiO_2$ and $TiO_2$ in Alumina Tubular Membranes: Pore Reduction and Effect of Surface Species on Gas Transport", Langmuir 2000, 16, pp. 7435-7444.

Horiike, Y. et al., "Filling of Si Oxide into a Deep Trench Using Digital CVD Method", App. Surface Science 46, (1990), pp. 168-174.

Wise, M. et al., "Diethyldiethoxysilane as a New Precursor for $SiO_2$ Growth on Silicon", Mat. Res. Soc. Symp. Proc. vol. 334, (© 1994 Materials Research Society), pp. 37-43.

* cited by examiner

METHODS OF FORMING PARTICLE-CONTAINING MATERIALS

TECHNICAL FIELD

The invention pertains to methods of forming particle-containing materials, and also pertains to semiconductor constructions comprising particle-containing materials.

BACKGROUND OF THE INVENTION

Semiconductor device fabrication typically involves formation of multiple layers over a semiconductor substrate. Various methods are known which can be utilized to form the layers, with exemplary methods including atomic layer deposition (ALD), chemical vapor deposition (CVD), and physical vapor deposition (PVD).

The present invention has particular application to ALD processes. ALD technology typically involves formation of successive atomic layers on a substrate. Such layers may comprise, for example, an epitaxial, polycrystalline, and/or amorphous material. ALD may also be referred to as atomic layer epitaxy, atomic layer processing, etc.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. It is noted that one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired. It is further noted that local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species may chemisorb to a substrate or previously deposited species, providing a surface onto which subsequent species may next chemisorb to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed species. Other process conditions, for example, pressure and temperature, may also influence chemisorption rate. Accordingly, observation indicates that chemisorption might not occur appreciably on portions of a substrate though it occurs at a suitable rate on other portions of the same substrate.

A continuing goal is to increase the density of semiconductor devices (i.e., to increase the level of integration of semiconductor devices), while maintaining or improving performance characteristics of the devices. In order to accomplish such goal, it is desired to develop alternative methods for forming layers of material across semiconductor substrates which can be utilized in addition to, or alternatively to, prior art methods.

SUMMARY OF THE INVENTION

The invention includes methods of forming particle-containing materials.

In one aspect, the invention encompasses a method of forming a particle-impregnated material over a semiconductor substrate. A first monolayer is formed across at least a portion of a surface of the semiconductor substrate. Particles are adhered to the first monolayer. A second monolayer is formed over the particles. The first monolayer, second monolayer and particles together are at least part of the particle-impregnated material.

In one aspect, the invention pertains to a method of forming a particle-impregnated conductive material over a semiconductor substrate. Particles are spread over the semiconductor substrate, and a monolayer of conductive material is formed over the particles.

In one aspect, the invention includes a semiconductor construction which contains a semiconductor substrate and a particle-impregnated conductive material over at least a portion of the semiconductor substrate. The particle-impregnated conductive material can comprise tungsten-containing particles within a layer comprising tantalum or tungsten.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes methods by which particles can be incorporated into layers during semiconductor device fabrication. In particular aspects, the particles can have a size from about 100 Å to about 10,000 Å, and in specific aspects the particles can be so-called nanoparticles. The particles can be formed remotely from a semiconductor substrate and then transferred to the substrate. This can allow the particles to be formed in environments particularly well-suited to particle fabrication, and can also allow avoidance of exposure of the semiconductor substrate to the environments utilized for particle formation. The conditions utilized to form the particles can thus be established to be economically highly suited for particle formation. Also, the conditions utilized to form the particles can be established to be conditions which would be detrimental to a semiconductor substrate if the substrate were exposed to such conditions, including, for example, conditions having excessive processing temperatures, pressures, or caustic materials which could damage or destroy features associated with a semiconductor substrate if the substrate were exposed to such conditions.

A difficulty associated with incorporating particles into semiconductor device features occurs in attempting to adhere the particles to a semiconductor substrate. Specifically, the particles can fall off of a semiconductor substrate if they are not appropriately adhered to the substrate. In particular aspects, the present invention utilizes ALD to form a particle-adhering layer over a semiconductor substrate prior to spreading of the particles onto the semiconductor substrate. In other aspects which could be utilized additionally to, or alternatively to, the above-described process, the invention includes methods in which a particle-adhering coating is provided over particles after spreading the particles across a semiconductor substrate. Exemplary aspects of the invention are described below with reference to FIGS. 1-12.

Figure 1:
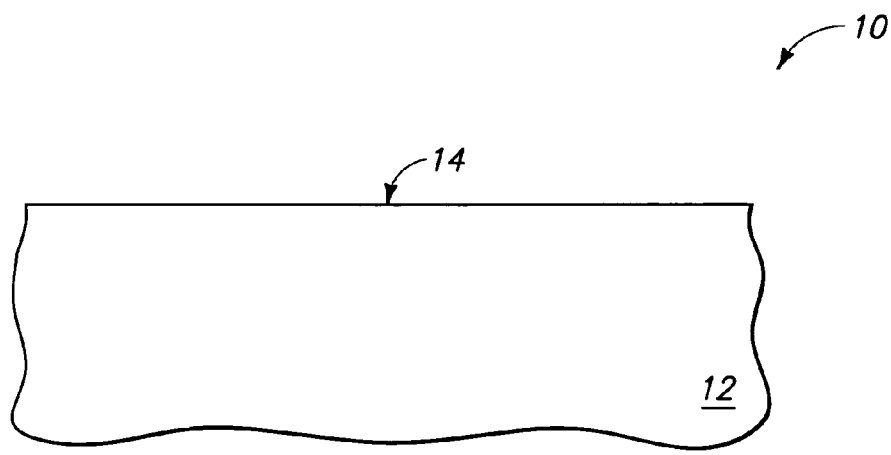
FIG. 1 is a diagrammatic, cross-sectional view of a semiconductor wafer fragment at a preliminary processing stage of an exemplary aspect of the present invention.

Referring initially to FIG. 1, a semiconductor construction 10 is illustrated at a preliminary processing stage. Construction 10 comprises a semiconductor substrate 12 having an upper surface 14. Substrate 12 can include, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Although substrate 12 is shown as being homogeneous in composition, it is to be understood that substrate 12 can comprise numerous layers at the processing stage of FIG. 1, including, for example, various stacked layers of insulative materials, conductive materials, and semiconductive materials. Further, substrate 12 can include various semiconductor devices (not shown).

Figure 2:
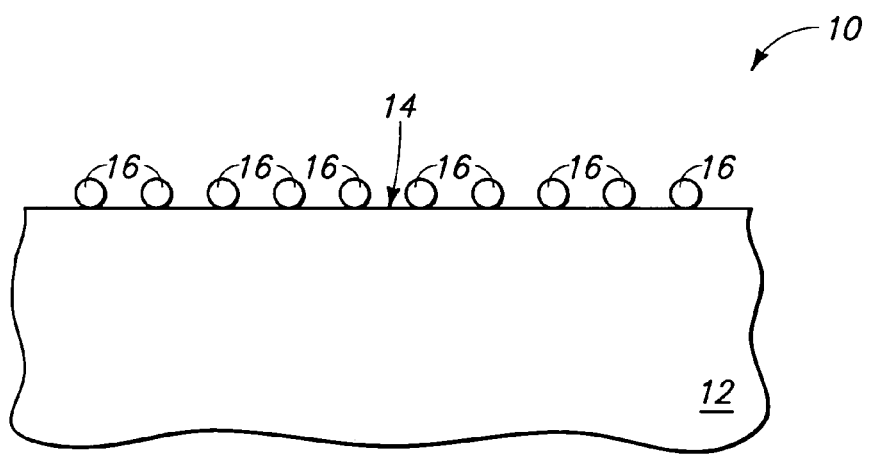
FIG. 2 is a view of the FIG. 1 wafer fragment shown at a processing stage subsequent to that of FIG. 1.

Referring to FIG. 2, a plurality of particles 16 are spread over upper surface 14. Particles 16 can be spread over surface 14 by any suitable method. In one aspect the particles suspended in a liquid carrier, the suspension can be spun onto the surface, and subsequently the liquid can be evaporated (e.g., dried) to leave the particles over the surface. Although particles 16 are shown forming a single layer across surface 14, it is to be understood that the particles can be spread to a density so that the particles form a multilayer stack over substrate 12. The particles can clump in various regions in some aspects of the invention so that the particle layer is not a constant height across the surface 14 of substrate 12.

Particles 16 can comprise any desired material which is ultimately to be incorporated into a layer over substrate 12. In particular aspects, the particles 16 can comprise insulative materials, such as, for example, one or more of silicon dioxide ($SiO_2$), amorphous carbon, silicon-carbon-oxygen, etc. If the particles comprise silicon dioxide, the silicon dioxide can, in particular aspects, be porous silicon dioxide.

Also, if the particles comprise silicon-carbon-oxygen, the particles can, in particular aspects, be considered to comprise, consist essentially of, or consist of carbon-doped silicon dioxide. Additionally to, or alternatively to, utilizing particles comprising, consisting essentially of, or consisting of electrically insulative materials, the particles can comprise, consist essentially of, or consist of electrically conductive materials. For instance, the particles can comprise, consist essentially of, or consist of tungsten, tungsten alloys, and/or tungsten compounds.

The particles can have any suitable size, and in particular aspects will have an average maximum dimension of from about 100 Å to about 10,000 Å. The particles are shown as being substantially spherical, but it is to be understood that the particles can have any shape, including, but not limited to, the spherical shape shown.

Figure 3:
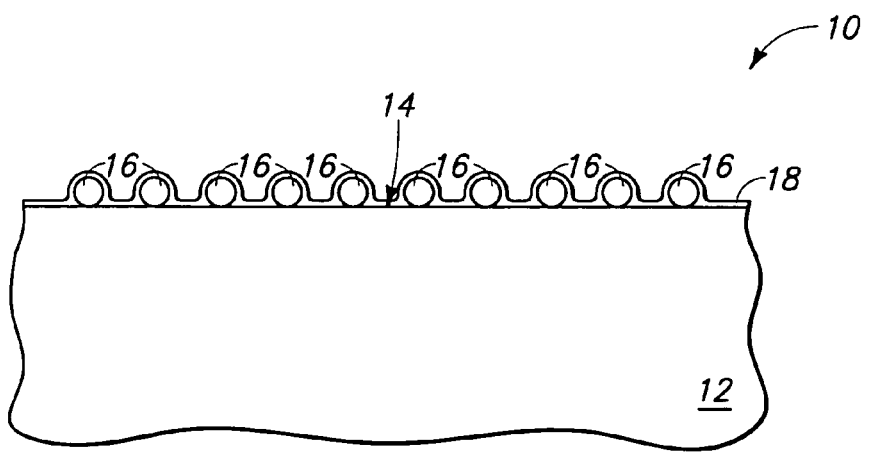
FIG. 3 is a view of the FIG. 1 wafer fragment shown at a processing stage subsequent to that of FIG. 2.

Referring to FIG. 3, a monolayer 18 is provided over particles 16 and across upper surface 14 of substrate 12 to adhere the particles to the upper surface. Monolayer 18 can be formed by atomic layer deposition, and can comprise any suitable material. In particular aspects, monolayer 18 can comprise a material ultimately utilized to form an electrically insulative layer, and in other aspects monolayer 18 can comprise a material ultimately utilized to form an electrically conductive layer. An exemplary process in which monolayer 18 can be ultimately formed into an electrically insulative material is as follows. Initially, monolayer 18 is formed from a precursor comprising a halogenated silane, with an exemplary precursor being dichlorosilane. Monolayer 18 will thus comprise silicon. In subsequent processing, the monolayer can be exposed to an oxygen-containing reactant (such as, for example, $H_2O$) to convert the silicon of monolayer 18 into silicon dioxide. Accordingly, monolayer 18 will be incorporated into a layer comprising, consisting essentially of, or consisting of silicon dioxide.

Monolayer 18 can be utilized to form a conductive layer by, for example, forming monolayer 18 to initially comprise a metal, and then incorporating the metal into a silicide or nitride. For instance, monolayer 18 can be initially formed to comprise tungsten, and the tungsten can subsequently be exposed to silane to incorporate at least some of the tungsten (in particular aspects all of the tungsten) into tungsten silicide. The tungsten of layer 18 can be formed from, for example, $WF_6$.

As another example, monolayer 18 can be formed to initially comprise tantalum, and at least some of the tantalum (in particular aspects all of the tantalum) can be exposed to $NH_3$ to incorporate the tantalum into tantalum nitride. The tantalum in monolayer 18 can be formed from, for example, $TaF_5$.

Monolayer 18 and particles 16 of FIG. 3 can together be referred to as a particle-impregnated material (or matrix). Also, if monolayer 18 is subsequently converted to a new composition through further processing (such as, for example, through exposure of layer 18 to a reactant, or through further ALD processing), the composition formed from layer 18 can, together with particles 16, be considered a particle-impregnated material (or matrix).

Figure 4:
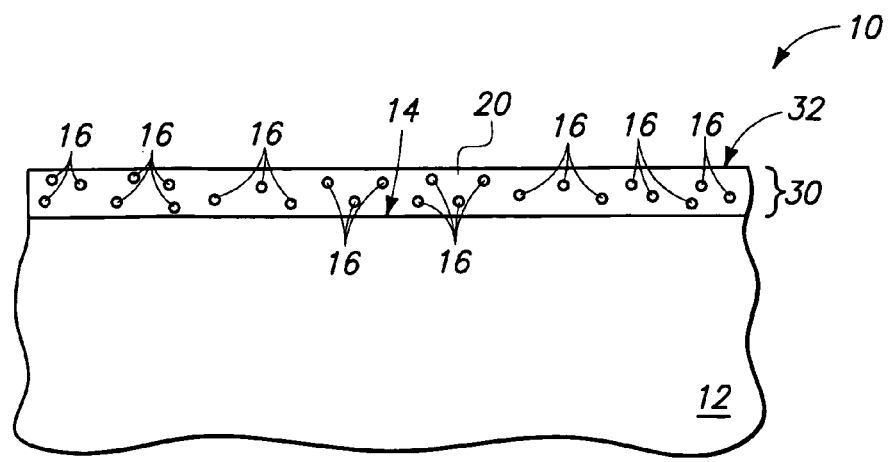
FIG. 4 is a diagrammatic, cross-sectional view of a semiconductor wafer fragment at a processing stage analogous to that of FIG. 3, but shown in accordance with an aspect of the invention alternative to that of FIG. 3.

The processing of FIGS. 2 and 3 can be repeated multiple times to form a particle-impregnated material to a desired thickness. FIG. 4 shows construction 10 after suitable processing to form a stack 30 of a particle-impregnated material 32 over substrate 12. The particles 16 within stack 30 are shown at a smaller scale than the particles 16 of FIG. 3. The scale of FIG. 4 reflects an aspect of the invention in which the particles 16 are small enough within stack 30 so that the particles do not appreciably affect a surface topography of the stack. The relative particle sizes of FIGS. 3 and 4 are utilized to emphasize that the invention encompasses utilization of either appropriately-sized particles to dominate a topography of a matrix comprising the particles, or appropriately-sized particles to not dominate a topography of a matrix comprising the particles. In some aspects the invention can also include utilization of a combination of particles have dramatically different sizes relative to one another.

Stack 30 is shown comprising a material 20 in place of the monolayer 18 of FIG. 3. Material 20 can correspond to a material formed from the monolayer 18, such as, for example, tantalum nitride, tungsten silicide, or silicon dioxide, utilizing the various exemplary aspects of the invention described previously.

The composition of particle-impregnated material 32 can be chosen to be suitable for any of various applications. For instance, particle-impregnated material 32 can be chosen to be an electrically insulative material. In such applications it can be desired that particles 16 comprise electrically insulative material, and further that composition 20 comprise an electrically insulative material. In exemplary aspects, particles 16 can comprise, consist essentially of, or consist of one or more of silicon dioxide, silicon-carbon-oxygen and amorphous carbon. Further, composition 20 can be chosen to be an electrically insulative composition, and can, for example, comprise, consist essentially of, or consist of silicon dioxide. In other aspects, particle-impregnated material 32 can be chosen to be an electrically conductive material, and in such aspects particles 16 can be chosen to be electrically conductive particles including, for example, particles comprising, consisting essentially of, or consisting of tungsten. Also, composition 20 can be chosen to be an electrically conductive composition, including, for example, a composition comprising, consisting essentially of, or consisting of tantalum nitride or tungsten silicide.

Electrically insulative particle-impregnated materials can be utilized in numerous semiconductor applications, including, for example, electrically isolating conductive devices from one another, or as dielectric portions of semiconductor devices. Particle-impregnated conductive materials can also be utilized in numerous semiconductor applications, including, for example, as components of conductive lines, and as conductive structures of semiconductor devices.

The aspect of the invention described above with reference to FIGS. 1-4 can be useful in applications in which particles 16 naturally interact with surface 14 to loosely adhere with the surface while layer 18 is formed, or in applications in which the construction of FIG. 2 is kept relatively steady until layer 18 is formed. However, the aspect of FIGS. 1-4 can be problematic if particles 16 shift across surface 14 excessively between the processing of FIG. 2 and that of FIG. 3.

FIGS. 5-8 illustrate an alternative aspect of the invention which can alleviate, and in particular aspects prevent, shifting of particles across a surface of a substrate prior to formation of a monolayer over the particles. In referring to FIGS. 5-8, similar numbering will be used as was used above in describing FIGS. 1-4, where appropriate.

Figure 5:
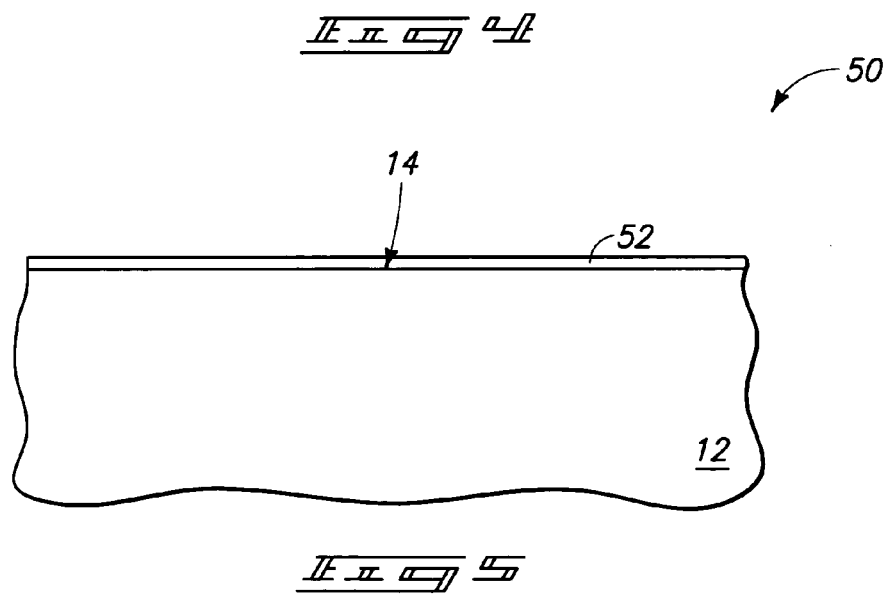
FIG. 5 is a diagrammatic, cross-sectional view of a semiconductor wafer fragment shown at a preliminary processing stage of a second embodiment aspect of the present invention.

Referring initially to FIG. 5, a construction 50 comprises a semiconductor substrate 12 having an upper surface 14. A layer 52 is formed over surface 14. In particular aspects, layer 52 will be a monolayer formed by ALD. Layer 52 can be referred to as a first monolayer to distinguish layer 52 from another monolayer (discussed below) formed subsequently to layer 52. Layer 52 is formed across at least a portion of the surface 14 of substrate 12, and in the shown aspect of the invention is formed across an entirety of upper surface 14. Layer 52 can be, for example, a monolayer formed from a precursor comprising halogenated silicon, with an exemplary precursor being dichlorosilane.

Figure 6:
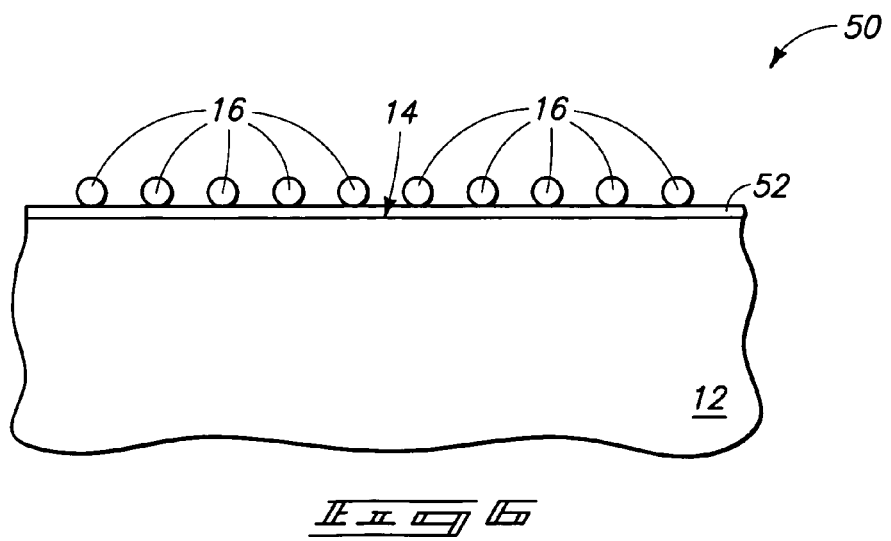
FIG. 6 is a view of the FIG. 5 wafer fragment shown at a processing stage subsequent to that of FIG. 5.

Referring to FIG. 6, particles 16 are spread over layer 52. The particles preferably have a composition which adheres to layer 52. For instance, if layer 52 is formed from dichlorosilane, the layer can comprise mono-chlorinated silicon. If particles 16 comprise silicon dioxide, oxygen from the silicon dioxide can displace chlorine from the mono-chlorinated silicon molecules to form covalent bonds to the silicon of monolayer 52. Such covalent bonds can adhere the particles to the monolayer.

Figure 7:
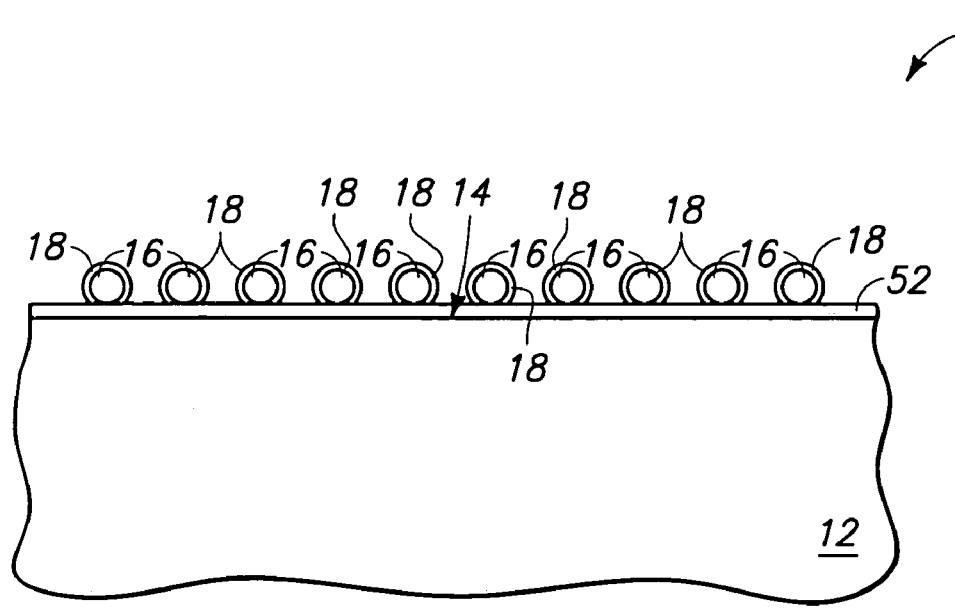
FIG. 7 is a view of the FIG. 5 wafer fragment shown at a processing stage subsequent to that of FIG. 6.

Referring to FIG. 7, a second monolayer 18 is formed over exposed surfaces of particles 16. Second monolayer 18 can be formed from, for example, the same precursor utilized to form first monolayer 52, and can be formed utilizing an ALD process. In the shown aspect of the invention, the second monolayer 18 is formed from a precursor which does not interact with a surface of first monolayer 52, but which instead selectively interacts with a surface of particles 16 to form a coating around the particles. If first monolayer 52 and second monolayer 18 are both formed from dichlorosilane, the first and second monolayers can subsequently be exposed to an oxygen-containing reactant (such as, for example, water) to convert at least some of the first and second monolayers (and in particular aspects an entirety of the first and second monolayers) to silicon dioxide. A particle-impregnated material can be considered to incorporate particles 16 and at least components from the first and second monolayers 52 and 18.

Figure 8:
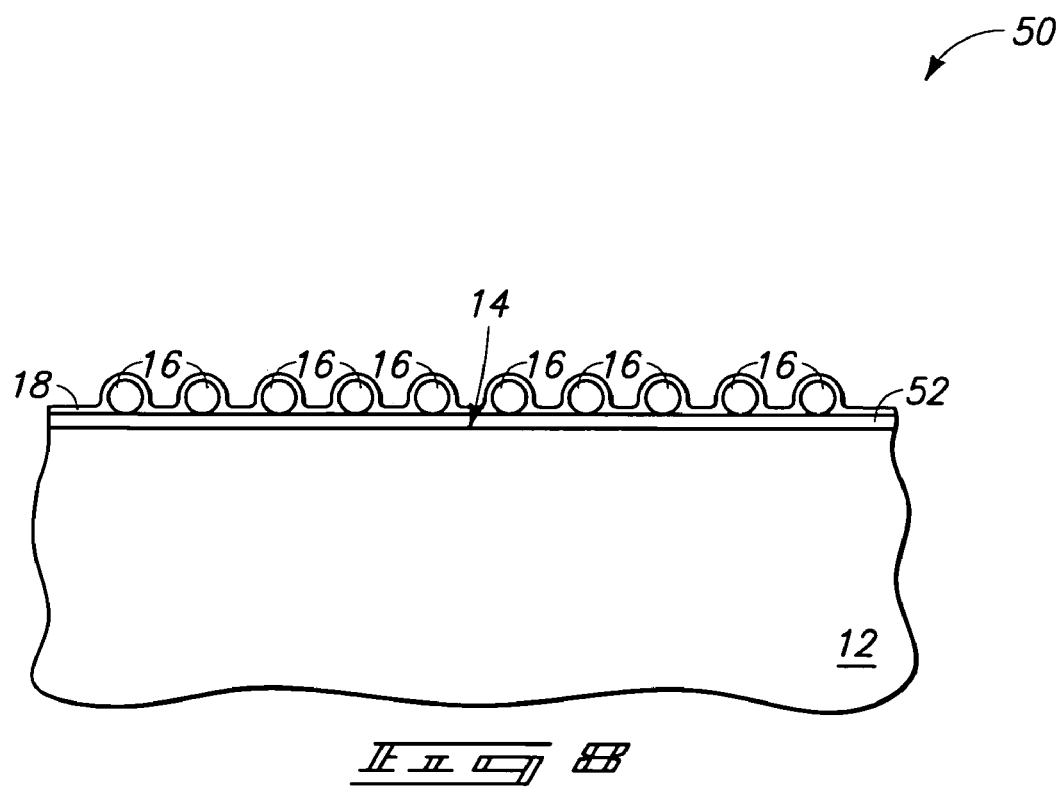
FIG. 8 is a view of the FIG. 5 wafer fragment shown at a processing stage subsequent to that of FIG. 6, and alternative to the processing stage of FIG. 7.

FIG. 8 illustrates an alternative aspect of the invention relative to that of FIG. 7. Specifically, monolayer 18 is shown formed across surfaces of particles 16, as well as across an upper surface of layer 52. The aspect of FIG. 8 can occur in, for example, applications in which monolayer 18 is formed from a material which interacts with the monolayer 52. Also, the embodiment of FIG. 8 can occur in applications in which monolayer 52 is initially formed as a composition to which layer 18 would not adhere, and is converted to a composition to which layer 18 will adhere prior to formation of layer 18. For instance, layer 52 can be initially formed from dichlorosilane, and can be converted to silicon dioxide after spreading particles 16 over layer 52, and prior to formation of layer 18. Subsequently, monolayer 18 can be formed from dichlorosilane, and will adhere to the surfaces of particles 16, as well as to the silicon dioxide of converted layer 52. In further subsequent processing, monolayer 18 can be converted to silicon dioxide. If particles 16 comprise, consist essentially of, or consist of silicon oxide, and if layers 18 and 52 are ultimately converted so that the layers comprise, consist essentially of, or consist of silicon dioxide, then a particle-impregnated material containing particles 16 together with layers 18 and 52 can comprise, consist essentially of, or consist of silicon dioxide.

The processing described with reference to FIGS. 5-8 can be utilized to form electrically insulative materials or electrically conductive materials. Specifically, layers 52 and 18, as well as particles 16, can be formed to be electrically insulative; or alternatively layers 52 and 18, together with particles 16, can be formed to be electrically conductive. Also, the invention can include applications in which particles 16 have an opposite conductivity to layers formed around the particles in a particle-impregnated material. For instance, the particle-impregnated material can comprise electrically insulative materials around electrically conductive particles, or electrically conductive materials around electrically insulative particles.

Figures 9, 10, 11:
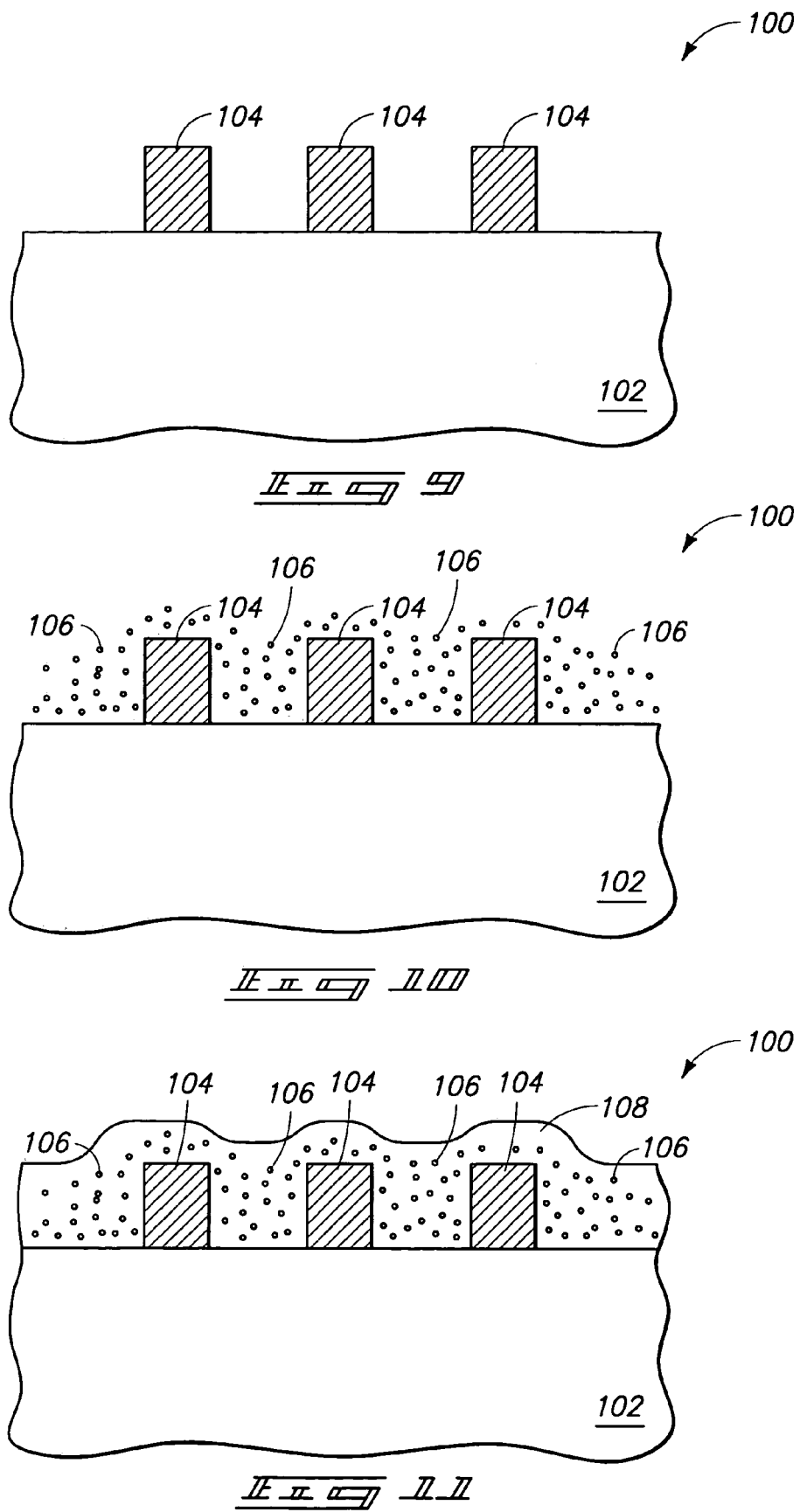
FIG. 9 is a diagrammatic, cross-sectional view of a semiconductor wafer fragment shown at a preliminary processing stage of a third embodiment aspect of the present invention.
FIG. 10 is a view of the FIG. 9 wafer fragment shown at a processing stage subsequent to that of FIG. 9.
FIG. 11 is a view of the FIG. 9 wafer fragment shown at a processing stage subsequent to that of FIG. 10.

The invention can have numerous applications for semiconductor fabrication. An application of the present invention for forming an electrically insulative material between electrically conductive structures is described with reference to FIGS. 9-12. Referring initially to FIG. 9, a semiconductor construction 100 comprises a substrate 102 having a plurality of conductive lines 104 thereon. Substrate 102 can comprise a semiconductor substrate. Although the substrate is shown as a homogeneous material, it is to be understood that the substrate can comprise stacks of various layers (not shown), as well as various semiconductor devices (not shown).

Conductive lines 104 extend into and out of the page in the view of FIG. 9. Although the conductive lines are shown as being homogeneous in composition, it is to be understood that the lines can comprise multiple layers of conductive materials. In particular aspects, the lines can comprise, consist essentially of, or consist of copper and/or copper alloys.

Referring to FIG. 10, a plurality of particles 106 (only some of which are labeled) are spread over substrate 102 and around conductive lines 104. The particles are shown floating in space between the lines for purposes of illustration, but it is to be understood that the particles would typically settle between the lines to form a porous layer of particles between the lines. Particles 106 can comprise electrically insulative materials, including, for example, one or more of silicon dioxide, amorphous carbon, and silicon-carbon-oxygen. The particles are shown having a relatively small size, but it is to be understood that much larger particles could be utilized.

Referring to FIG. 11, a composition 108 is formed over and between the particles 106, as well as over and between the lines 104. Composition 108 can comprise one or more layers formed by ALD processing, and accordingly can be formed from one or more monolayers. In particular aspects, composition 108 will comprise silicon dioxide and will be formed through ALD processing utilizing one or more iterations of:

(1) forming a monolayer from a precursor comprising a halogenated silicon (such as, for example, dichlorosilane); and (2) exposing the monolayer to an oxygen-containing reactant to convert at least some of the silicon within the monolayer (and typically all or at least substantially all of the silicon of the monolayer) to silicon dioxide.

A material comprising composition 108 together with particles 106 can be considered to be a particle-impregnated material. In particular aspects of the invention, such particle-impregnated material will correspond to a low dielectric constant (low-K) material, or in other words to a material having a dielectric constant less than that of silicon dioxide. The shown scale of the particles relative to the deposited layer is such that the deposited layer is thick compared to a dimension of the particles. It is to be understood, however, that the relative thickness of the deposited layer to the particles can be substantially different than that shown in FIG. 10, and can be, for example, similar to the scale shown FIG. 3.

Figure 12:
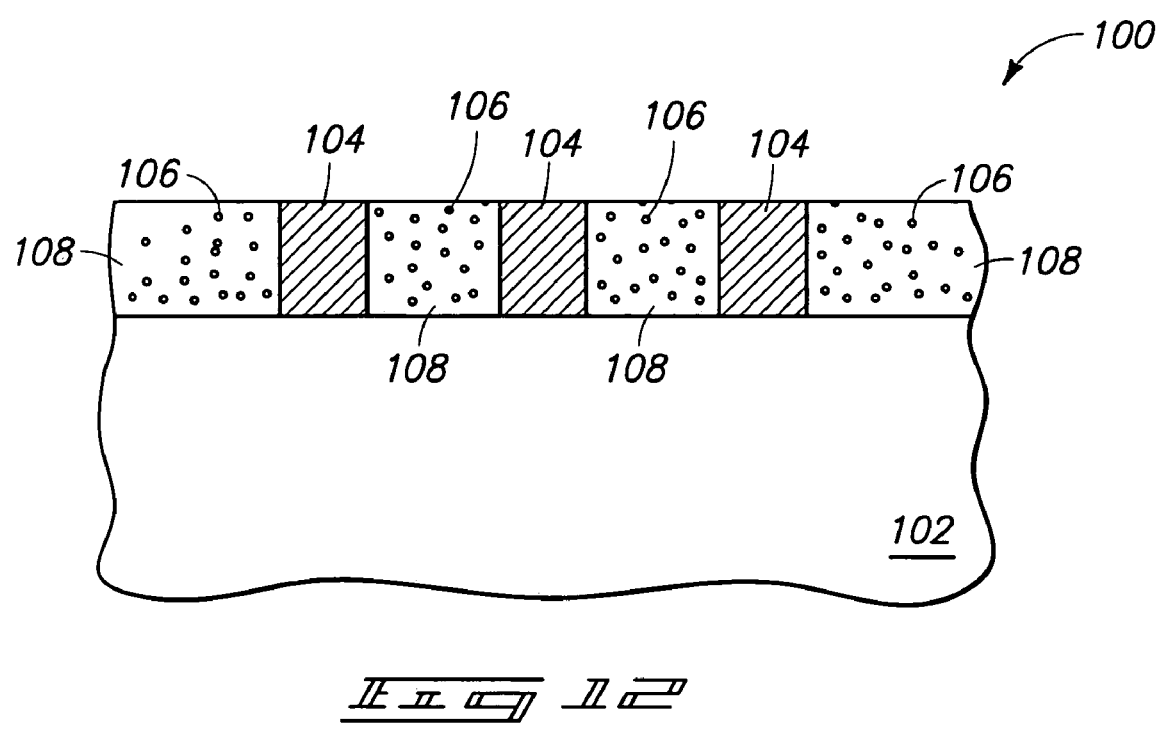
FIG. 12 is a view of the FIG. 9 wafer fragment shown at a processing stage subsequent to that of FIG. 11.

Referring to FIG. 12, an upper surface of the particle-impregnated material comprising composition 108 and particles 106 is planarized. Such planarization can be accomplished utilizing, for example, chemical-mechanical polishing. The particle-impregnated material between conductive lines 104 electrically isolates the conductive lines, and forms a base upon which subsequent semiconductor devices (not shown) can be supported.

The processing described with reference to FIGS. 9-12 corresponds to an aspect of the invention similar to that of FIGS. 1-4, and specifically to an aspect of the invention in which particles 16 are directly deposited over a substrate. It is to be understood that the invention also encompasses processing analogous to that of FIGS. 9-12, but in which an adhesive monolayer (such as the monolayer 52 of FIG. 5) is formed prior to provision of the particles 106 of FIG. 10.

The examples described above are exemplary applications of the present invention, and are not to limit the invention. It should be understood that the invention can be utilized in numerous other applications. For instance, the particles described above can be used to support a catalytic material formed over the particles, and can be used to increase a surface area of the catalytic material. The catalytic material having increased surface areas could have numerous uses, including, for example, use in fuel cells. In one application, the particles can comprise, consist essentially of, or consist of $SiO_2$, and the catalytic material can comprise, consist essentially of, or consist of atomic layer deposited platinum; accordingly the catalytic material formed over the particles will have a platinum-containing catalytic surface. In subsequent processing, at least some of the $SiO_2$ can be removed with an appropriate etch. As another example of an application of the present invention, the particles can comprise, consist essentially of, or consist of carbon nanotubes, and can be utilized to impart conductivity and/or strength to a material formed over the particles. The layer formed across the nanotubes can support the nanotubes and thus retain the tubes in a desired orientation, such as, for example, a standing orientation. As yet another example of an application of the present invention, the particles can comprise photoluminescent and/or electroluminescent materials and can be incorporated into display devices utilizing methodology of the present invention. Such can be particularly useful if the particles comprising photoluminescent and/or electroluminescent materials are formed under conditions that would be detrimental to other components of the display device, in that the particles can be formed remotely from a display device substrate and then attached to the display device substrate with methodology of the present invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a particle-impregnated electrically conductive material over a semiconductor substrate, comprising:

providing the semiconductor substrate to comprise a substantially planar upper surface;

providing a mixture containing particles in a liquid carrier;

spreading the mixture over and directly against the substantially planar upper surface of the semiconductor substrate, and then evaporating the liquid carrier to leave the particles dispersed over and directly against said substantially planar upper surface;

utilizing atomic layer deposition to form a metal-containing monolayer over and directly against the dispersed particles;

incorporating the metal of the monolayer into metal silicide or a metal nitride; the metal silicide or metal nitride being electrically conductive material directly against the particles; and wherein the electrically conductive material and particles together are at least part of the particle-impregnated electrically conductive material.

2. The method of claim 1 wherein the particles are electrically conductive.

3. The method of claim 1 wherein the particles comprise carbon nanotubes.

4. The method of claim 1 wherein the particles comprise photoluminescent or electroluminescent materials.

5. The method of claim 1 wherein the particles comprise tungsten.

6. The method of claim 5 wherein the monolayer comprises tungsten.

7. The method of claim 6 wherein the electrically conductive material comprises tungsten silicide.

8. The method of claim 5 wherein the monolayer comprises tantalum.

9. The method of claim 8 wherein the electrically conductive material comprises tantalum nitride.

10. The method of claim 1 wherein the particles have an average maximum dimension of from about 100 Å to about 10,000 Å.

11. The method of claim 1 wherein the monolayer comprises tungsten.

12. The method of claim 1 wherein the monolayer comprises tungsten, and wherein the electrically conductive material comprises tungsten silicide.

13. The method of claim 12 wherein the monolayer is formed from $WF_6$.

14. The method of claim 1 wherein the monolayer comprises tantalum.

15. The method of claim 1 wherein the monolayer comprises tantalum, and wherein the electrically conductive material comprises tantalum nitride.

16. The method of claim 15 wherein the monolayer is formed from $TaF_5$.

* * * * *